(12) United States Patent
Andle et al.

(10) Patent No.: US 7,936,110 B2
(45) Date of Patent: May 3, 2011

(54) LATERAL EXCITATION OF PURE SHEAR MODES

(75) Inventors: Jeffrey C Andle, Falmouth, ME (US);
Daniel Scott Stevens, Stratham, NH (US); Reichl B Haskell, Nashua, NH (US)

(73) Assignee: Delaware Capital Formation, Inc., Wilmington, DE (US)

( * ) Notice: Subject to any disclaimer, the term of this patent is extended or adjusted under 35 U.S.C. 154(b) by 175 days.

(21) Appl. No.: 12/404,288

(22) Filed: Mar. 14, 2009

(65) Prior Publication Data
US 2010/0231092 A1 Sep. 16, 2010

(51) Int. Cl.
*H01L 41/08* (2006.01)

(52) U.S. Cl. ........ 310/333; 310/336; 310/338; 310/365; 310/369; 73/579

(58) Field of Classification Search .......... 310/333, 310/336, 338, 365, 369; 73/579
See application file for complete search history.

(56) References Cited

U.S. PATENT DOCUMENTS

| | | | | |
|---|---|---|---|---|
| 4,268,912 A | * | 5/1981 | Congdon | 367/163 |
| 5,117,696 A | * | 6/1992 | Schmid | 73/514.34 |
| 5,696,423 A | * | 12/1997 | Dydyk et al. | 310/346 |
| 7,075,216 B1 | * | 7/2006 | Vetelino | 310/338 |
| 7,456,708 B2 | * | 11/2008 | Chou et al. | 333/187 |
| 2007/0144240 A1 | | 6/2007 | Andle | |
| 2007/0252485 A1 | * | 11/2007 | Kawakubo et al. | 310/365 |
| 2008/0036335 A1 | * | 2/2008 | Naito et al. | 310/361 |
| 2008/0100176 A1 | | 5/2008 | Haskell et al. | |
| 2008/0163694 A1 | | 7/2008 | Haskell et al. | |
| 2008/0190181 A1 | * | 8/2008 | Khuri-Yakub et al. | 73/64.53 |
| 2009/0151428 A1 | * | 6/2009 | Bhethanabotla et al. | 73/24.06 |

FOREIGN PATENT DOCUMENTS

| | | | | |
|---|---|---|---|---|
| JP | | 55-90116 A | * 7/1980 | 310/365 |
| WO | WO/2007/123537 | | 11/2007 | |
| WO | WO/2007/123539 | | 11/2007 | |

OTHER PUBLICATIONS

An Analysis of SC-Cut Quartz Trapped Energy Resonators with Rectangular Electrodes, D. S. Stevens and H. F. Tiersten, 35th Annual IEEE Frequency Control Symp., pp. 205-212 (1981).
U.S. Appl. No. 12/036,125 to Andle, filed Feb. 22, 2008, titled "Sensor, system, and method, for measuring fluid properties using Multi-Mode Quasi-Shear-Horizontal Resonator".
U.S. Appl. No. 12/202,431 to Andle et al., filed Sep. 2, 2008, entitled "Asymmetric Composite Acoustic Wave Sensor".
"Forced torsional vibrations of a semi-infinite piezoelectric medium of (622) class", H.S. Paul and K. Venkateswara Sarma, Department of Mathematics, Indian Institute of Technology. Dwonloaded from www.new.dli.ernet.in/rawdataupload/upload/insa/INSA__2/20005ad4__362.pdf.

(Continued)

*Primary Examiner* — Thomas M Dougherty
(74) *Attorney, Agent, or Firm* — Shalom Wertsberger; Saltamar Innovations

(57) ABSTRACT

Circularly polarized resonant structures are obtained utilizing piezoelectric resonators made of materials and orientations selected in accordance with the teaching provided herewith. Further provided are radially polarized structures. Furthermore, the utilization of such resonators and structures as sensors, for frequency control application, for signal filtering, and the like, is also disclosed.

38 Claims, 9 Drawing Sheets

OTHER PUBLICATIONS

"Self-alligned lateral field excitation film acoustic resonator with very large electromechanical coupling", Wei Pang Hongyu, Jae Wan kwon, Hoa Zhang, and Eun Sok Kim, 2004 IEEE International Ultrasonics, Feroelectrics, and Frequency Control Joint 50th Anniversary Conference (558-561), IEEE 2004.

"Energy trapping of thickness shear vibrations excited by parallel electric field and its application to piezoelectric vibratory gyroscopes", Hiroshi Abe, Tetsou Yoshida, and Hiroshi Watanabee, IEEE Ultrasonic symposium (467-471), 1998.

"Three Modes of Operation of an Acoustic Wave Device with Lateral Field Excitation Structure" C. Zhang et al. In paper 6D-5 at the 2008 IEEE Ultrasonics Symposium (443-446).

"The Detection of Chemical and Biological Analytes Using a Monolithic Spiral Coil Acoustic Transduction Sensor", D. McCann et al., paper 5C-2, 2008 IEEE Ultrasonics Symposium, (1187-1190).

"Novel electrode configurations of lateral field excited acoustic wave devices on (yxl)-58° LiNbO3", C. Zhang et al., 5C-4 at the 2008 IEEE Ultrasonics Symposium (276-279).

* cited by examiner

Prior Art Fig. 5a

|  | $C_{14}$ | $C_{44}$ | $C_{66}$ | $e_{14}$ | $e_{26}$ | $\alpha_x = \alpha_y$ | $\alpha_z$ |
|---|---|---|---|---|---|---|---|
| | | | Excessive $C_{14}$ and low $e_{14}$ | | | | |
| α-SiO$_2$ | -17.9 | 57.9 | 39.85 | -0.0406 | -0.171 | 13.7 | 7.48 |
| LGS | 14.15 | 53.71 | 42.21 | 0.13 | 0.402 | 5.6 | 4.1 |
| LGN | 14.85 | 49.56 | 41.14 | 0.061 | 0.452 | 6.7 | 5.6 |
| LGT | 13.6 | 51.12 | 40.17 | 0.051 | 0.518 | 6.1 | 3.8 |
| AlPO$_4$ | -12.9 | 43.02 | 29.4 | 0.02 | -0.14 | 15.9 | 9.7 |
| STGS | 1.2 | 56 | 43.50 | -0.004 | 0.421 | 9.70 | 3.20 |
| | | | Desirably low $C_{14}$ and high $e_{14}$ | | | | |
| GaPO$_4$ | 3.91 | 37.66 | 22.38 | ~0.09 | -0.209 | 12.78 | 3.69 |
| SNGS | 4.4 | 54.9 | 43.5 | 0.15 | -0.478 | 6.5 | 7.5 |
| CNGS | -0.636 | 40.05 | 39.41 | -0.335 | 0.439 | 1.70 | 0.10 |
| CTGS | 0.44 | 40.9 | 45.1 | 0.42 | 0.41 | 0.698 | 0.744 |
| CTAS | 0.268 | 45.5 | 47.15 | -0.22 | 0.402 | 0.756 | 0.815 |
| β-SiO$_2$ | 0 | 35 | 48 | 0.08 | 0 | | |
| α-TeO$_2$ | 0 | 24.4 | 55.2 | 0.22 | 0 | 17.7 | 5.5 |

Fig. 7

LATERAL EXCITATION OF PURE SHEAR MODES

FIELD OF THE INVENTION

This invention relates to piezoelectric device in general, and more particularly to electrodes, materials, and substrates for lateral field excitation of pure shear mode resonators.

BACKGROUND OF THE INVENTION

There is a growing need for an in situ measurement of fluid properties and conditions. Historically such measurements were made using discretely-sampled, laboratory-based instruments or using manual gauges under a periodic maintenance schedule. In many industrial and commercial applications, the value of continuous process monitoring and process control are driving the development of new sensor technologies that can bring a reasonable subset of the laboratory instruments' capabilities directly into the process control and monitoring systems. In particular, there exists a need for a precision sensor to measure the viscosity of liquids and to perform other physical and chemical measurements within a liquid environment. Such a sensor should have little interference from other fluid properties.

Piezoelectric crystal sensors—and, in particular, thickness shear mode (TSM) resonators, while operated as sensors—have been shown to be promising candidates for such applications. The piezoelectric sensor offers a transduction mechanism between the physical loading of a mechanical structure and the electrical properties observed at one or more electrical ports.

The descriptions and specifications herein will be made clearer through the definition of several terms. Those terms not specifically defined below should be construed to conform to industry standard definition with primary reliance on the 1987 IEEE Standards on Piezoelectricity, ANSI/IEEE Std 176-1987, (The IEEE Standard hereinafter).

'Mirror Surface' or 'Acoustic Mirror Surface': a surface being an ideal plane surface, an ideal contoured surface (spherical or linear bevel), or having local deviations from an ideal plane surface or ideal contoured surface that are small compared to the acoustic wavelength. In these specifications, "small deviations" should be smaller than about 2% of a wavelength. The surface may define a boundary between the resonant acoustic wave device (AWD) and any other medium having a poor acoustic impedance match (such as water, air, vacuum, polymer, oil and the like, by way of example) giving rise to an acoustic reflection coefficient.

In the case of contoured surfaces, the surface is locally planar with a curvature, typically tailored to create an essentially spherical mirror with a defined focal length. Structures with textured surfaces, such as those provided by way of example in US patent application publication No. 2007-0144240 to Andle (which is incorporated herein by reference in its entirety) also fall within the scope of the term mirror surfaces provided that the textures represent deviations of less that 2% of the wavelength.

'Mechanical planar structure' or 'planar structure': A structure having at least two opposing 'acoustic mirror surfaces', said surfaces being functionally parallel surfaces, thereby allowing substantially collinear reflection of a wave therebetween, and having lateral extents at least four times its thickness. Classic examples include plano-plano resonators, plano-convex resonators, bi-convex resonators and the like. Planar structures may be embedded within a larger structure. A contoured structure falls within the present definition of a planar structure provided that the lateral dimensions of the structure are at least four times the maximum thickness.

By way of example, an inverted mesa is a planar structure etched into a larger substrate which is substantially inactive to the resonant mode of the planar structure. Further, multilayered structures, composite structures, and structures comprising composite materials offering homogeneous acoustic properties at the dimensional scale of the acoustic wavelength at least in the lateral direction are explicitly included within the term planar structures.

'Trapped energy resonators': a resonator which comprises a mechanical planar structure having a piezoelectric region, and in which the acoustic energy is substantially confined between the two faces of said structure and substantially confined laterally within the region defined by either contouring of the planar structure thickness or by mass loading and/or piezoelectric shorting associated with an optional transducer structure. The article "An Analysis of SC-Cut Quartz Trapped Energy Resonators with Rectangular Electrodes", D. S. Stevens and H. F. Tiersten, $35^{th}$ Annual IEEE Frequency Control Symp., pp. 205-212 (1981) discloses some typical examples of such trapped energy resonators.

Symmetry groups' (equivalently referred to as 'Point groups') are defined in the IEEE Standards on Piezoelectricity based on the rules of symmetry of repeating structure with respect to a point. The field of crystallography allows for seven crystal systems related to unit cells consisting of parallelepipeds having sides defining natural axes a, b, and c. Directions are defined in an 'inverse space' related to these coordinates. "As referred to the set of rectangular axes X, Y, Z, these indices are in general irrational except for cubic crystals. Depending on their degrees of symmetry, crystals are commonly classified into seven systems: triclinic (the least symmetrical), monoclinic, orthorhombic, tetragonal, trigonal, hexagonal, and cubic. The seven systems, in turn, are divided into point groups (classes) according to their symmetry with respect to a point. There are 32 such classes, eleven of which contain enantiomorphous (right and left handed) forms. Twelve classes are of too high a degree of symmetry to show piezoelectric properties. Thus twenty classes can be piezoelectric. Every system contains at least one piezoelectric class. A convenient summary of the 32 classes with examples is given in Table 3 of the IEEE standard."

The IEEE Standard goes on to define the various symmetry groups and the assignment of mineral (a, b, c) to rectangular (X, Y, Z) Cartesian coordinates. The relationship between orientation and rotation is further stated. "To characterize a piezoelectric crystal, a set of piezoelectric constants is needed; and in order to make them unambiguous, a sign convention is necessary for both the constants and the axis sense. A specific relation between the a, b, c axes of crystallography and the X, Y, Z axes is given in 3.2.1-3.2.6, and summarized in Table 3 (of the IEEE Standard). The reader is cautioned at this point that, without general agreement on sign conventions, there can be much confusion. Data expressed in terms of one abc-XYZ relation look very different from the same data in terms of another abc-XYZ relation. In this IEEE Standard, the positive senses of the XYZ axes are defined such that certain piezoelectric constants are positive. Details for determining senses of the XYZ axes are described in 3.5. The choice of the positive sense is arbitrary in some cases. A discussion of static measurements related to sign determination will be found in 6.3." The IEEE Standard goes on to show examples of rotated coordinates and the associated material properties. Throughout this document, it is assumed that the coordinate system is for unrotated ZX plates unless explicitly shown and/or described otherwise (such as done in relation to FIGS. 1 and 2). The IEEE standard strictly applies only to crystals, having translational symmetry (a repeating unit cell) and rotational symmetry (point groups); however common materials are not always single crystals and there exist polycrystalline materials and oriented polymers having piezoelectric properties. The general literature contemplates such materials that are aggregates, as well as other non-crystalline materials that are not considered by the IEEE Standard. The present application also refers to symmetry group ∞2. The infinite symmetry operator indicates isotropic properties around the primary axis. For example, a polycrystalline material with the c-axis oriented along Z but with random rotation of the individual crystal domains about their c axis will appear to be isotropic in the lateral directions and have infinite symmetry.

'Shear mode': a displacement vector field, $\vec{u}$, such that the magnitude of u is constant along any given closed field lines (mathematically $\nabla \cdot \vec{u} = 0$) and vary between adjacent, substantially parallel, field lines (mathematically $\nabla \times \vec{u} \neq 0$).

'Thickness shear mode': an acoustic displacement vector field substantially parallel to the surface, having its primary change in magnitude along the axis substantially perpendicular to the surface.

'Face shear mode': an acoustic displacement vector field substantially parallel to the surface, having its primary change in magnitude along an axis lying substantially in the plane of the surface.

'Radial shear mode': a face shear mode in which the acoustic displacement vector field has significantly angular motion and the primary change in magnitude is substantially along the radius.

'Lateral field excitation (LFE)': the common term, referred to as lateral excitation in the IEEE Standard. LFE refers to the piezoelectric coupling between a lateral electric field component and acoustic stresses or strains within the structure. In these specifications, LFE shall relate to excitation intended to excite shear modes of vibration in light of the specific emphasis of improved LFE of shear mode resonators.

'LFE excitation supporting material' shall be defined as a material, composite material, structure, or composite structure such that, if the thickness direction is defined to be $X_3$ (Cartesian Z), then the aggregate piezoelectric properties provide non-trivial values for one or more of the shear coupling constants, $e_{14}$, $e_{15}$, $e_{16}$, $e_{24}$, $e_{25}$, and $e_{24}$.

'Thickness field excitation (TFE)': TFE refers to the piezoelectric coupling between a perpendicular electric field component and acoustic stresses or strains within the structure. In the present specifications, TFE represents an undesired excitation and will be intended to include the ability to excite any modes of vibration using a thickness-aligned electric field.

'TFE excitation supporting material' shall be defined as a material, composite material, structure, or composite structure such that, if the thickness direction is defined to be $X_3$ (Cartesian Z), then the aggregate piezoelectric properties provide non-trivial values for one or more of the shear coupling constants, $e_{31}$, $e_{32}$, $e_{33}$, $e_{34}$, $e_{35}$, and $e_{36}$.

'Effective Thickness Inactive Piezoelectric (ETIP)': a material, composite material, structure, or composite structure such that, if the thickness direction is defined to be $X_3$ (Cartesian Z), then the aggregate piezoelectric properties provide a trivial value for the sum of the squares of the six piezoelectric constants, $e_{3,j}$, compared to the sum of the squares of the remaining shear coupling constants, $e_{14}$, $e_{15}$, $e_{16}$, $e_{24}$, $e_{25}$, and $e_{24}$.

'Circularly polarized (CP)': a curvilinear polarization of displacement vector, u, such that the field lines form non-crossing, closed loops. By way of example, FIG. 4a illustrates a simple circular polarization but the similarly, square, ellipsoid, triangular, and many other shapes fall under the definition, due to the functional definition of the field lines formed by such polarization.

'Quadrature symmetry piezoelectric (QSP)': a material, composite material, structure, or composite structure such that, if the thickness direction is defined to be $X_3$ (Cartesian Z), then the aggregate piezoelectric properties approximately or fully satisfy either or both of $$e_{25} \sim -e_{14} \neq 0 \text{ and } e_{15} \sim e_{24} \sim 0$$

or $$e_{26} \sim -e_{16}.$$

Most preferably only one condition is met and the remaining piezoelectric constants are zero.

'Effective shear decoupled substrate (ESDS)': a material, composite material, structure, or composite structure such that, if the thickness direction is defined to be $X_3$ (Cartesian Z), then the aggregate elastic properties provide for trivial values for the matrix elements $C_{14}$, $C_{15}$, $C_{16}$, $C_{24}$, $C_{25}$, $C_{26}$, $C_{34}$, $C_{35}$, $C_{36}$, and their transpose values. An ESDS offers little or no acoustic coupling between extensional modes and shear modes.

'Effective pure shear substrate (EPSS)': an ESDS that further provides for trivial values for the matrix elements $C_{46}$, $C_{56}$, and their transpose values. An EPSS offers little or no acoustic decoupling between circularly polarized shear modes and other spurious modes.

'Coplanar circularly polarized transducer (CCPT)': a plurality of electrodes formed on a common surface (planar or curvilinear) such that one or more electrode forms an functionally closed shape, said plurality of electrodes forming a plurality of shapes, each of said shapes being fully enclosed by, or fully enclosing, another shape and defining a gap therebetween. The electrodes therein are defined as coplanar circularly polarized electrodes (CCPE) and a CCPT comprises a plurality of coplanar circularly polarized electrodes separated by at least one gap therebetween.

'Functionally closed shape' implies that small gap or gaps in the shape may be introduced that, while geometrically breaking the closed shape, will have minimal effect on the circular polarization induced by the CCPT. By way of example, such gap or gaps may be utilized for connecting metal to an enclosed electrode. FIGS. 6, 8, 9, and 10 show the simplest case of concentric coplanar electrodes being two-terminal, single port transducer structures. FIG. 11 illustrates some more complex cases incorporating three-terminal, two-port structures offering isolated input and output ports. The figure also illustrates that the incorporation of interconnecting metal between said closed shapes or through small breaks in said shapes is explicitly contemplated.

'Circularly polarized LFE (CP-LFE)': broadly defined as a nontrivial piezoelectric coupling between a circularly polarized acoustic displacement field and an applied potential via the lateral field components of the electric fields associated with said potential.

'Functionally Z-cut': a material, composite material, structure, or composite structure such that, if the thickness direction is defined to be $X_3$ (Cartesian Z), then the aggregate elastic and piezoelectric properties of said material, composite material, structure, or composite structure, if measured, would closely be described by constants substantially unrotated from Z-cut as given in the IEEE Standard.

Throughout the definitions and the discussion that follows it is implicit that the piezoelectric effect is reciprocal and that if an electric field can excite an acoustic field, then said acoustic field can conversely excite the corresponding electric field. Teachings in which an electric potential is applied and a resonance is excited implicitly incorporate the converse.

Prior art FIG. 1 illustrates a simplified cross section of a quasi-parallel plate TSM resonator in which the acoustic displacements are confined between two nominally mirror surfaces 109a and 109b. TSM resonators are widely employed in frequency control and in sensor applications since the energy efficiency remains good with air loading and even with fluid loading. Other acoustic modes tend to couple energy into the bounding medium unless the boundaries are maintained in vacuum. The acoustic vibration is polarized parallel to the surfaces along X and the amplitude of said vibrations varies with thickness along Z. The example in FIG. 1 uses thickness field excitation (TFE) wherein the electric field is polarized parallel to the thickness of the crystal. Cartesian coordinates are shown typical of a simple ZX plate as defined in the IEEE Standard. Rotation of the crystallographic axes is typically required to obtain desirable properties and is assumed implicitly. The top surface 109a supports a common electrode 102. The lower surface 109b supports active input 103 and output 104 electrodes that respectively apply and sense electric vector fields with respect to the common electrode 102. The figure illustrates the electric vector fields of the driven 107 and sensed 108 thickness field excitation (TFE) resonators and the associated trapped energy acoustic displacements 105 and 106. The relative polarity corresponds to the known symmetric mode of the coupled resonator, monolithic crystal filter (MCF).

The overwhelming majority of the prior art employs planar surface, parallel plate (colloquially known as plano-plano) resonators. For illustrative purposes, the piezoelectric element 101 in FIGS. 1 and 2 is not drawn to scale and the curvature of the mirror surfaces 109a and 109b is exaggerated, to illustrate more clearly the breadth of the concept disclosed herein and its applicability to a wide variety of planar structures. Despite the graphical exaggeration, the figures are meant to depict a width exceeding four times the thickness.

The idealized TFE structure has a Z-variation of an X displacement, being stress and strain component 5 in the IEEE Standard. The Z material would support TFE of the desired mode only if the rotated piezoelectric constant, $e_{35}$, is non-trivial. Rotating around the X axis such that crystallographic Y was normal to the surface would attain this result in quartz.

An alternate prior art sensor geometry is illustrated in FIG. 2, which depicts a resonator sensor using lateral field excitation (LFE). A lateral electric vector field 111 applied between electrodes 103 and 104 is parallel to X and excites a thickness shear acoustic displacement field 110 parallel to Y with variation along Z. Electrode 102 is optional in this case and serves no role in the desired lateral field excitation (LFE) of the structure.

The stress/strain component is 4 according to the IEEE Standards. The Z material would support LFE of the desired mode only if the rotated piezoelectric constant, $e_{14}$, is non-trivial.

It will be clear to the skilled in the art that inclusion of an upper electrode 102 in proximity to the LFE electrodes 103 and 104 will introduce both TFE excitation and LFE excitation causing measurement difficulties and/or errors.

The coupling strength of a wave coupled to a piezoelectric device is typically approximated as $$k^2 = \frac{e^2}{\varepsilon \overline{C}}$$

where e is the effective piezoelectric constant ($e_{14}$ for LFE and $e_{35}$ for TFE), $\varepsilon$ is the appropriate dielectric constant, and $\overline{C}$ is the effective elastic constant. For LFE in a Y-cut crystal as depicted in FIG. 2, $\overline{C}$ equals approximately $(1+k^2_{LFE})C_{44}$ while for TFE it is approximately $(1+k^2_{TFE})C_{55}$. A preferred embodiment for a LFE device would have $k^2_{LFE} \gg k^2_{TFE}$, requiring the rotated constants to provide $e_{14} \gg e_{35}$. Quartz and $LiNbO_3$ substrate orientations, presently employed in LFE sensor devices do not meet these requirements.

In addition to the thickness field piezoelectric coupling of FIG. 1 and the lateral field excitation shown in FIG. 2, excitation through one or more spiral antenna/transducer systems is also known. This approach does not provide exclusively LFE but rather applies both lateral and thickness fields. Furthermore, the radial fields excite radially-polarized thickness shear modes, not circularly polarized shear modes.

The purely shear displacement component of an acoustic wave cannot couple to an ideal liquid. There exists a slight perturbation from this ideal case for a viscous liquid. The viscously entrained liquid has laminar flow and alters both the resonant frequency and power loss (crystal resistance) of the piezoelectric resonator sensor. The sensor may also interact with adsorbed mass or stiffening viscoelastic films on the surface, as is well known in the art.

Presently, thickness shear mode is the most popular solution to fluid phase sensing using piezoelectric sensors. These sensors typically employ a linearly-polarized acoustic displacement substantially in the plane of the planar polished surface. Components of displacement perpendicular to the surface cannot be avoided in present designs and result in radiative losses of acoustic energy into the fluid. The precise measurement of certain physical and chemical parameters often makes minimization or elimination of such unrelated fluid interactions highly desirable.

In frequency control applications the resonator is not placed in contact with a liquid; however radiative losses into air can limit performance and, again, the perpendicular components of displacement are undesirable.

These undesirable radiative losses are inherent to finite geometry resonators. An ideal resonator, constrained in only the thickness dimension but of infinite lateral dimension, does not suffer from such loses, but is clearly impractical. Real resonators have finite lateral dimensions and exhibit energy distributions similar to those seen in FIG. 3. FIG. 3 assumes a Y-cut plate in accordance with a prior patent application from which it is reproduced. Introducing finite length, l, along X, illustrates the problem. The mode profile is shown with a wave displacement 301 for n=1 and j=1 as $U_X = A_X \sin(\pi Y/t) \cos(\pi X/l)$. In practice there is finite extension of the wave beyond the electrodes and j=J−δ. Also shown is the corresponding amplitude component 302, $U_Y(X,Y) = (t/l)A_X \sin(\pi X/l)\sin(\pi Y/t)$ for j=1.

Introducing a finite dimension in X introduces a lateral variation to $U_x$ that can be simplistically estimated as $U_X(X,Y,Z) = A_X \cos(j\pi X/l)\sin(n\pi Y/t)\cos(m\pi Z/w)$ for a length, l, and width, w. The wave-vector gains an X component, $K_x = j\pi/l$. In this case the shear wave condition of $U \cdot K = 0$ is no longer satisfied unless there is an additional acoustic amplitude, $U_Y(X,Y,Z)=jt/nl\ A_X\ \sin(j\pi X/l)\sin(n\pi Y/t)\cos(m\pi Z/w)$. Finite extent along the direction of vibration results in a vertical wave component and the pure shear solution is no longer tangentially polarized at the device's surface. This results in local vertical motion of the interface between the resonator and the surrounding medium and the associated radiation of energy, causing compressional waves to radiate into the surroundings. In practical devices this effect is minimized by selecting a pure shear horizontal substrate, making the mode number, j, small and employing electrodes with small thickness to length ratio (approximating infinite plane devices). As such, common wisdom teaches the use of large electrode area to minimize compressional wave radiation limited by the required frequency separation of additional anharmonic modes. While mitigating the effect, in some applications further improvement is still required.

While thickness shear modes are by far the most common planar structure, the variation of amplitude could occur along a direction in the surface plane but perpendicular to the direction of the acoustic vibration. This motion is known as face shear since the exposed face of the crystal is deformed in a shear motion. The analogous motion to face shear in cylindrical coordinates provides circular lines of motion with amplitudes that vary along the radius of a disk. Such a circularly polarized face shear mode is a radial shear mode.

The defining feature common to the state of the art is the induction by the structure, of acoustic displacement vector fields with primarily linear polarization that have divergence at one or more boundaries of the sensor's active area, as depicted in FIG. 3, taken from application U.S. Ser. No. 12/036,125 to Andle, titled "Sensor, system, and method, for measuring fluid properties using Multi-Mode Quasi-Shear-Horizontal Resonator", which is incorporated herein by reference. The '125 disclosure analyzes the effects of divergence in linearly polarized quasi-shear wave resonators in further detail and presents methods through which to employ the non-shear components of said resonances. Specifically the '125 invention relies on the subtle differences in the interaction of two or more acoustic resonance states or waveguide modes of a multi-mode resonator or waveguide. The most preferred embodiment is a dual-mode coupled resonator filter geometry with one resonant mode having a high degree of symmetry and the other having a high degree of anti-symmetry. By combining the additional information of multi-mode operation with the inherent ability of a horizontally-polarized quasi-shear-horizontal acoustic wave device (AWD) to operate in fluid environments, one obtains a multi-mode quasi-shear-horizontal (MMQSH) resonator.

In contrast, the present invention seeks to minimize or eliminate these non-shear components to obtain a substantially pure shear mode resonance with substantially horizontal polarization. The pure shear wave has zero net divergence of the acoustic displacement vector field. Such divergent fields at the device boundary require a conversion of in-plane (horizontal) shear displacement into other out-of-plane displacements. This conversion invariably leads to surface motion normal (vertical) to the plate surface of the crystal, and an associated radiation of propagating wave energy into even an ideal liquid. Such radiation in turn leads to frequency shifts and radiative losses under fluid load that are independent of viscosity or that occur even in air. Such radiative loses reduce the measurement precision, especially of low viscosity fluids. The associated frequency shifts and losses are also independent of added mass, further reducing sensor reliability as a microbalance for the detection of small added masses. In frequency control applications the Q of the resonator and therefore the stability of the oscillator are impacted by even the compressional wave radiation into air.

There exists significant motivation to discover structures in which the divergence of the acoustic displacement fields truly is zero everywhere and which do not suffer competing mode excitation methods. A vector displacement field with zero divergence is solenoidal, i.e. it forms closed lines of field flux. In a planar device these acoustic displacement vector field lines are preferentially parallel to the surface with nominally circular lines of flux as schematically depicted in FIG. 4a. A top view of the substrate 401 depicts idealized lines of surface displacement counterclockwise 402 and clockwise 404 with a dashed line indicating the null of motion 403. The null of movement frequently occurs at the region of maximum shear strain (derivative of the rate of change of amplitude of adjacent lines of movement). The amplitude of the vector displacement field is equal at all points on a given closed line and there are thus no divergences of the vector field.

A mode having non-divergent flux lines of its vector field being substantially parallel to the surface of the substrate and substantially circular or elliptical in form, as depicted in the idealized case of FIG. 4a, shall be deemed "circularly polarized". The angle of the lines of acoustic displacement vector field components with respect to the surface shall be within 10° to be considered substantially parallel, preferably within 5°, and most preferably within 1°. The prior art case of FIG. 4b depicts a side view of a substrate 407 having lines of displacement 405 representing the fields of a traditional TSM resonator. Near the points of divergence at the ends of the vectors there exists a vertical component of motion corresponding to an angle of the vector with respect to the surface of $\theta$ 406. Since the vectors are time harmonic, the angle is also time harmonic and $\theta$ is the magnitude. The ends of the vectors "flap" up and down, causing piston-like radiation of sound waves into the adjacent media. Only in the limiting case of small angles are these unwanted losses minimized.

A circularly polarized wave has lines of displacement that close upon themselves and therefore have neither a beginning nor an end, eliminating the problematic divergence as was seen in FIG. 4a. Since the magnitude of the displacement is substantially equal on any such loop, there is no conversion to plate-normal components. It should be noted that for anisotropic crystals the polarization is more elliptical than circular and for the purposes of this disclosure "circularly polarized" shall broadly include any mode representing a solution to the coupled wave equations and having a mode shape having substantially zero divergence. The patterns 402 and 404 represent one such arbitrary case and the actual patterns will be dictated by the crystal symmetry of the substrate 401 and the geometry of the transducer, which should be judiciously chosen to best match the substrate anisotropy.

There is a long felt, and as of yet unresolved need in the industry for a fluid/liquid property sensor that will overcome the disadvantage and inaccuracies of present sensors. Furthermore, there is a significant advantage for providing a mechanical planar structure which minimizes out-of-plan divergence in shear mode resonators for other applications such as frequency control, and the like.

SUMMARY OF THE INVENTION

It is therefore a goal of the present invention to provide an improved lateral excitation for piezoelectrically causing pure or nearly pure shear modes in mechanical planar structures. Such lateral excitation will support additional goals of the invention, such as providing improved resonators for use as sensors, for frequency control applications, for signal filtering, as well as the use of more efficient piezoelectric transformers and the like. Thus preferred embodiments of the invention include piezoelectric resonators made of materials and orientations selected in accordance with teaching provided herein, and circularly polarized as described herein. Aspects of the invention are further directed to the utilization of such resonators as sensors, for frequency control application, for signal filtering, and the like.

It is yet another objective of the present invention to provide an essentially planar, circularly polarized, pure or nearly pure shear mode resonator using lateral field excitation. It is an objective of the present invention to provide a planar structure supporting a circularly polarized shear mode. The excitation and energy trapping of such a mode, as well as of the desired planar structure, is enabled by a judicious choice of materials, crystal symmetry group, orientation, and electrode structure.

Thus there is provided a mechanical planar structure comprising a substrate comprising an effective thickness inactive piezoelectric (ETIP) material, and a plurality of coplanar electrodes coupled to the ETIP. The electrodes are separated by at least one gap, and are excitable by an alternating electric potential. When the electrodes are coupled to the electric potential, the ETIP supports lateral field excitation (LFE) of a thickness shear mode. The substrate may comprise a composite material.

In one preferred embodiment, a rigid protector plate having a driven face and a sensing face, and further having a thickness which is substantially a multiple of half wavelength of a resonant frequency of the substrate is also provided. The substrate has an excitation face, and being of thickness of substantially a multiple of half wavelength of said resonant frequency in said plate. The coplanar electrodes are coupled to the excitation face. The substrate is coupled to the protector plate, forming an energy interface therebetween, such that a wave of said resonant frequency traveling between the excitation face and the sensing face, shall form a substantially continuous-phase wave, at substantially peak displacement amplitude, at the energy interface.

Preferably, the substrate, or a portion thereof, comprises a plurality of piezoelectric regions aligned to have their crystallographic Z axis substantially perpendicular to the surfaces of said planar structure.

The ETIP may comprise one or more piezoelectric regions, at least one of which being selected to belong to a symmetry group chosen from symmetry groups 32, 422, 622, $\infty$2, and $\bar{6}$, or a combination thereof. The substrate preferably having a layer comprised of one of the following piezoelectric materials: CNGS, CTGS, CTAS, CNAS, β-SiO$_2$, α-TeO$_2$, STGS, SNGS, STAS, SNAS, and an alloy of (Sr,Ca)$_3$(Nb,Ta)(Ga,Al)$_3$Si$_2$O$_{14}$. Preferably the substrate is selected to have a magnitude of the rotated aggregate elastic constant $C_{14}$ being less than 0.1 times the magnitude of $C_{44}$. Also preferably the substrate is selected to have a magnitude of the rotated aggregate piezoelectric constant $e_{26}$ being less than 0.1 times the magnitude of $e_{14}$.

Optionally the mechanical planar structure or a portion thereof, forms an inverted mesa.

In certain embodiments, the ETIP comprises of a plurality of piezoelectric regions wherein at least one of the regions is not an ETIP, but wherein the aggregate of said plurality of regions forms an ETIP.

Preferably, the electrodes are substantially concentric.

In another aspect of the present invention there is provided a mechanical planar structure supporting circularly polarized shear modes, comprising a substrate comprising quadrature symmetry piezoelectric (QSP) material. A plurality of coplanar circularly polarized electrodes (CCPES) is coupled to the substrate, and said electrodes are separated by at least one gap therebetween forming a coplanar circularly polarized transducer (CCPT). When said electrodes are coupled to electric potential, the substrate supports circularly polarized lateral field excitation (CP-LFE) of a shear mode resonance. Optionally, the substrate comprises an ETIP and may or may not be of composite material.

Optionally a rigid protector plate as described above may be coupled to the substrate, as described above.

The substrate or a portion thereof may comprise a plurality of piezoelectric regions being aligned to have their crystallographic Z axis substantially perpendicular to the surfaces of the planar structure. Optionally the substrate comprises one or more piezoelectric regions, at least one of which being selected to belong to a symmetry group chosen from symmetry groups 32, 422, 622, $\infty$2, and, or a combination thereof. The functionally Z-cut oriented regions may be differently rotated about the Z axis to provide destructive interference of coupling between the lateral fields and spurious modes.

Preferably the substrate comprises a material belonging to symmetry group $\bar{6}$. Also preferably the substrate has at least one layer comprised of one of the following piezoelectric materials: CNGS, CTGS, CTAS, CNAS, β-SiO$_2$, α-TeO$_2$, STGS, SNGS, STAS, SNAS, and an alloy of (Sr,Ca)$_3$(Nb,Ta)(Ga,Al)$_3$Si$_2$O$_{14}$. Further optionally, the ETIP comprises of a plurality of piezoelectric regions wherein at least one of said regions is not an ETIP, but wherein the aggregate of said plurality of regions forms an ETIP. In a preferred embodiment the ETIP comprises a material having only symmetry group 422, 622, $\infty$2, or a combination thereof.

Optionally the substrate, or a portion thereof, forms an inverted mesa. Preferably the electrodes are substantially concentric. Preferably, the plurality of electrode is substantially circular in form, and at least a second and a third of said plurality of electrodes are arcuate in form and are disposed externally to said circular electrode.

In one embodiment the resonance is a thickness shear mode resonance, while in another the resonance is a radial shear mode resonance.

In a preferred embodiment, the substrate comprises a first and a second layers of QSP material, where first and second layers each having a thickness of substantially a multiple of a resonant wavelength of the structure, wherein the first and second layers being in face to face relationship therebetween, and wherein the electrodes are disposed between said first and second layers. The first layer may differ in thickness from said second layer.

Preferably the planar structures described herein support at least a first mode which is substantially pure shear with no circumferential variance of amplitude (K=0), and at least a second mode having intentional circumferential variance of amplitude (K≠0) so as to have significant non-tangential displacement components. The first and second modes being electrically responsive to viscosity-density product of an adjacent material with substantially equal sensitivity, $S_v$. The first and second modes are electrically responsive to elasticity-density product of an adjacent material with unequal sensitivities, $S_{\rho 0}$ and $S_{\rho 1}$, Thus allowing the structure to provide independent information on the viscosity and density of said adjacent material.

A circularly polarized monolithic crystal filter is also provided, wherein the CCPE forms a two-port CCPT having separate input and output ports. This is achieved by having the CCPT comprise of a substantially complete circular common electrode, and a plurality of arcuate segments functionally enclosing the common electrode. At least a first of the segments forms an input transducer with respect to said common electrode, and at least a second segment forms an output transducer with respect to said common electrode. Other segments may be present if desired. Preferably, the first segment and the second segment define a split therebetween, the split being positioned such that electric fields between said segments traversing said split are substantially aligned with the crystallographic X axis of said substrate. If more than two segments are provided, preferably the split separates the first and second segments on opposite sides of the Y and _Y crystallographic axis of the substrate.

SHORT DESCRIPTION OF DRAWINGS

The summary, above, and the following detailed description will be better understood in view of the enclosed drawings. It should however be noted that the invention is not limited to the precise arrangement shown in the drawings and that the drawings are provided merely for non-limiting illustrative purpose.

FIG. 5a depicts a hypothetical resonator response on a substrate having both LFE and TFE coupling of equal magnitude.

FIG. 7 provides a table of materials that meet the criteria of "effective thickness inactive piezoelectric (ETIP)" substrates when aligned as Z cut. The upper group materials are useful, but the lower group materials are applicable to the more preferable embodiments.

Figure 8A:
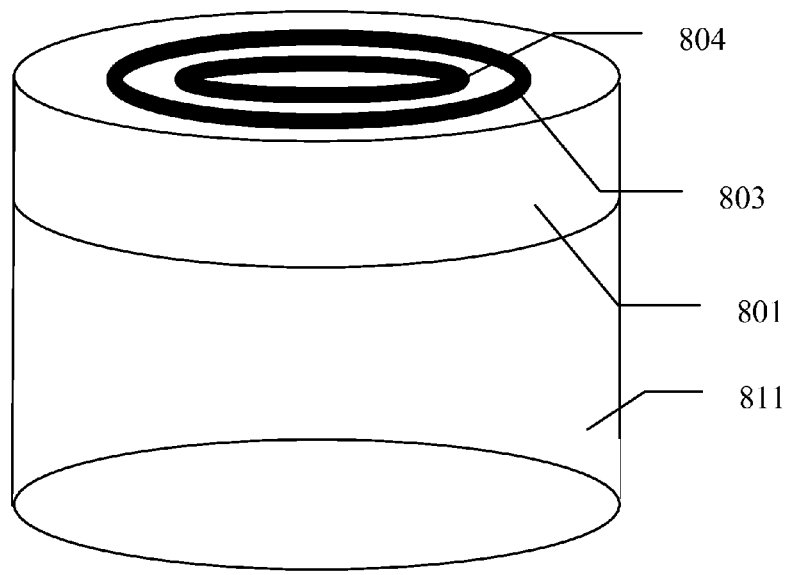
Figure 8B:
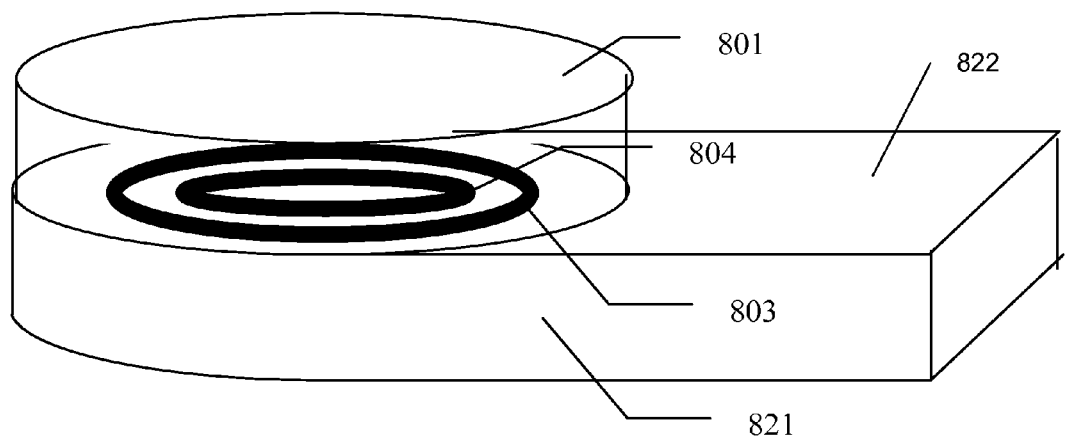

FIG. 8a illustrates an asymmetric composite resonator having coplanar circularly polarized transducer (CCPT). FIG. 8b illustrates an embodiment similar to FIG. 8a, in which the support material forms a mounting handle.

Figure 9:
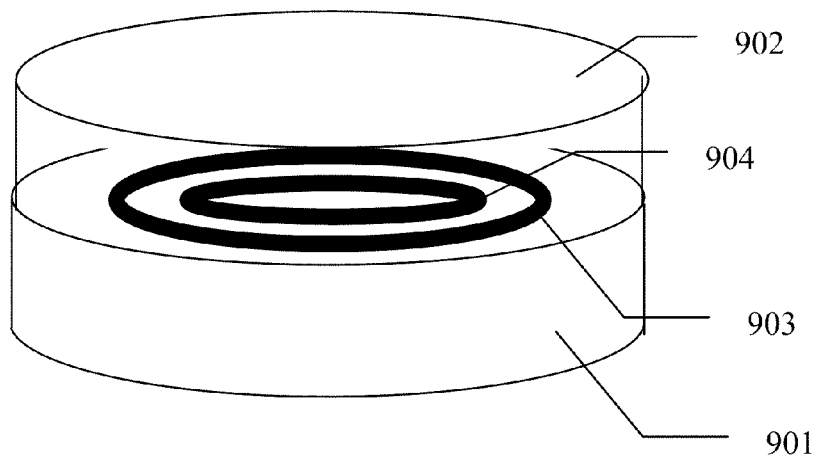

FIG. 9 illustrates a symmetric composite resonator having coplanar circularly polarized transducer (CCPT).

Figure 10:
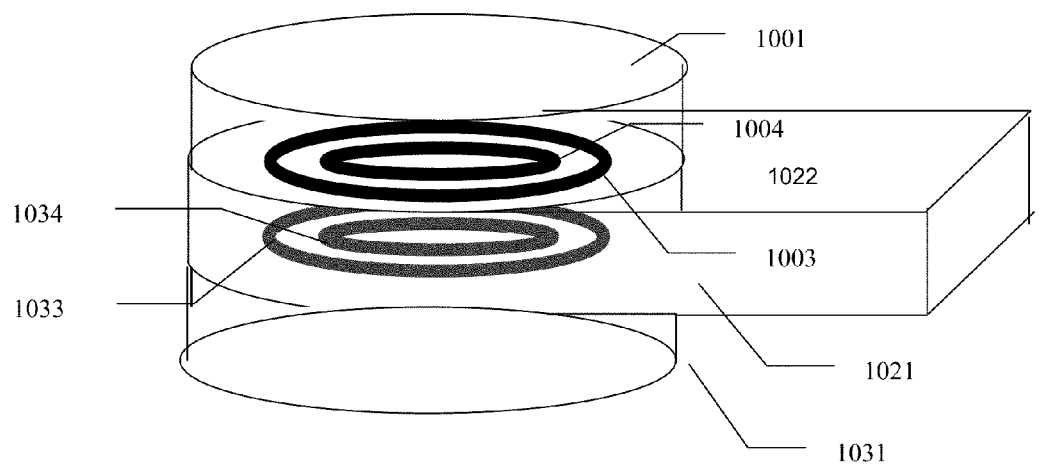

FIG. 10 illustrates an extension of FIG. 8b to the symmetric composite resonator.

FIG. 11a-d illustrate some practical coplanar circularly polarized transducer (CCPT) structures showing examples of electrode layout for various embodiments of the invention.

DETAILED DESCRIPTION

Material selection and orientation chosen to eliminate or minimize piezoelectric coupling to interfering resonant modes will provide an improved LFE device. To this end, there is provided an effective thickness inactive piezoelectric (ETIP). The simplest embodiment of an ETIP employs functionally Z-cut piezoelectric crystal of a symmetry class having the piezoelectric constants associated with an electric field parallel to Z, $e_{3J}$, approximately equal to zero. Other methods involve the design of composite materials and composite structures that offer the aggregate properties of an ETIP.

Embodiments of ETIP include, inter alia, aggregate materials having average values of $e_{3J}$ being trivially small to within a specified tolerance even if individual REGIONS of the aggregate substantially depart from the definition of the ETIP as a whole, as the ETIP is considered to be defined by the characteristics of the aggregate. Such materials are macroscopically homogeneous but microscopically heterogeneous. A collection of crystallites in a composite matrix might have varied composition and alignment other than Z-cut; however, their macroscopic properties might behave the same as a Z-cut crystal of the desired symmetry. A typical threshold for 'trivial' with regards to the squares of the piezoelectric constants is a factor of 10. A factor of 100 is more desirable.

In addition to offering LFE with minimized spurious modes, a further advantage of using Z-cut crystals is that the thermal expansion in the X and Y directions are identical by symmetry in all of the symmetry groups being considered. This can significantly simplify packaging and the selection of compatible materials for composite devices.

There would still exist unwanted $e_{26}$ based coupling (as $e_{11}$ and $e_{12}$) to extensional modes in at least crystal symmetry group 32. Rotating the alignment of the coplanar parallel plates on the Z-cut plate allows the ability to adjust the properties of interfering modes. Providing multilayered or other composite materials could provide $e_{26}=0$ if desired.

Figure 1:
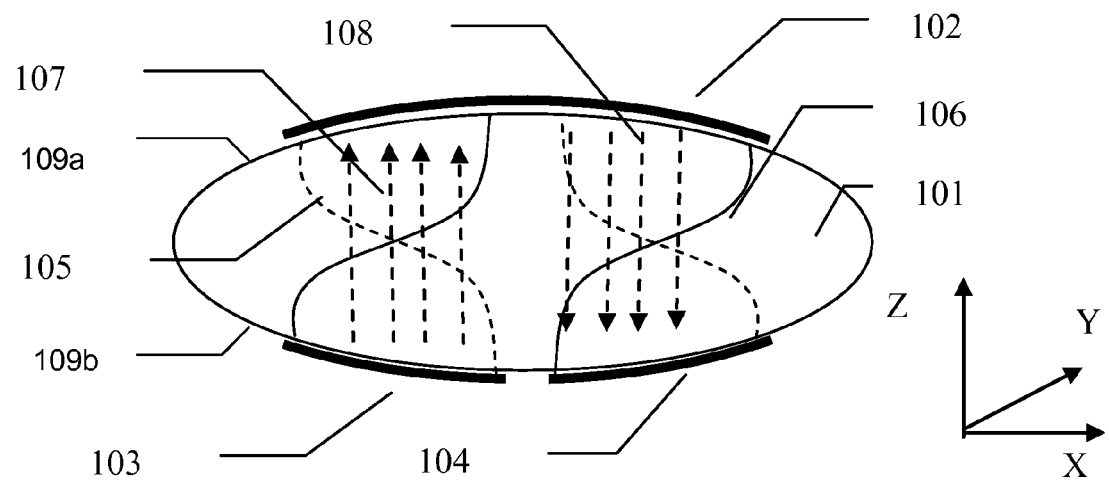
FIG. 1 depicts a prior art monolithic crystal filter using thickness field excitation (TFE).
Figure 2:
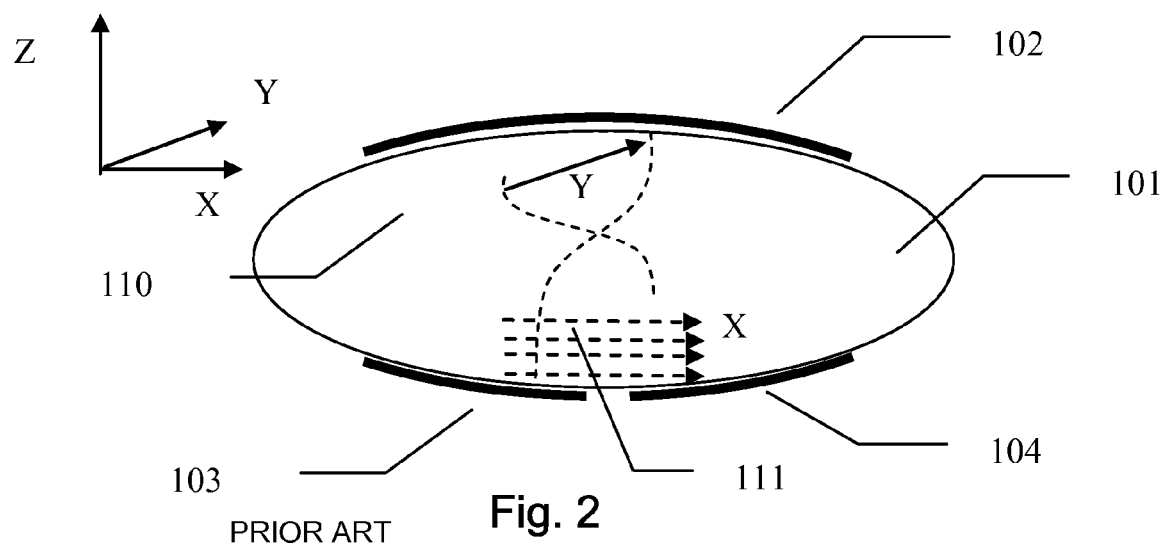
FIG. 2 depicts a prior art resonator sensor using lateral field excitation (LFE).

Modifying the prior art resonator depicted in FIG. 1 according to the present teaching, utilizing a functional Z-cut substrate provides an ETIP which will reduce spurious modes. Doing so allows sensing changing electrical boundary conditions at the surface 109a opposite the LFE electrodes 103 and 104, while minimizing parasitic TFE resonator modes 105 and 106. A reduction in the spurious modes results, providing a more desirable LFE resonator.

FIG. 5a depicts the hypothetical conductance (G) of a resonator versus frequency (ω) for a prior art resonator having approximately equal piezoelectric coupling for LFE and TFE mechanisms. LFE produces the resonance 501 at a frequency determined by the associated rotated elastic constant, $C'_{44}$, while TFE produces the resonance 502 at another frequency determined by the rotated elastic constant, $C'_{55}$. For orientations other than Z-cut these constants differ in most symmetry groups and both applied electric fields have non-zero piezoelectric coupling. The depiction of equal coupling in the figure represents a worst case.

Figure 5B:
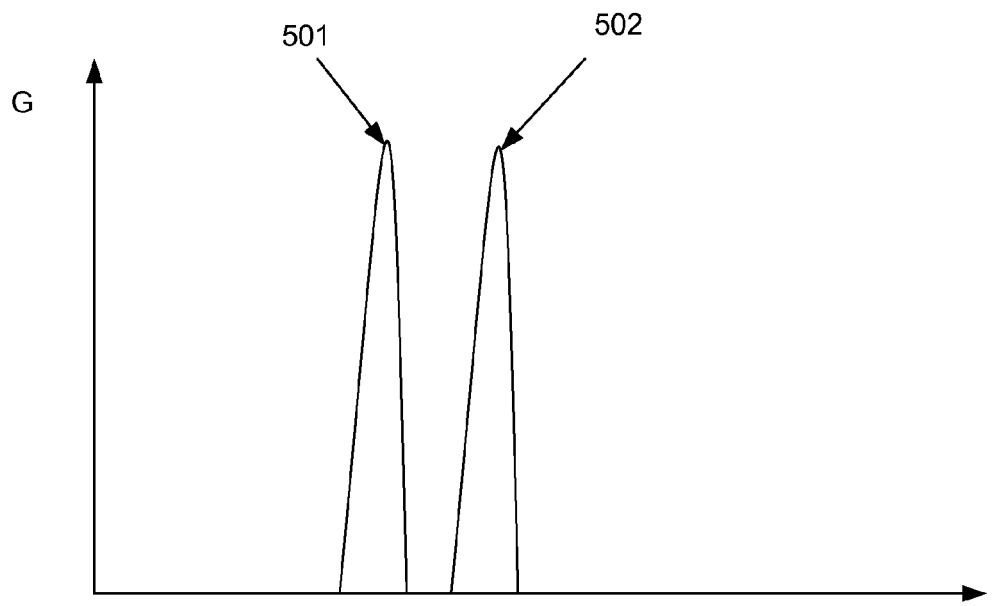
FIG. 5b depicts the hypothetical resonator electrical response of an LFE device on an ETIP.
Figure 5B:
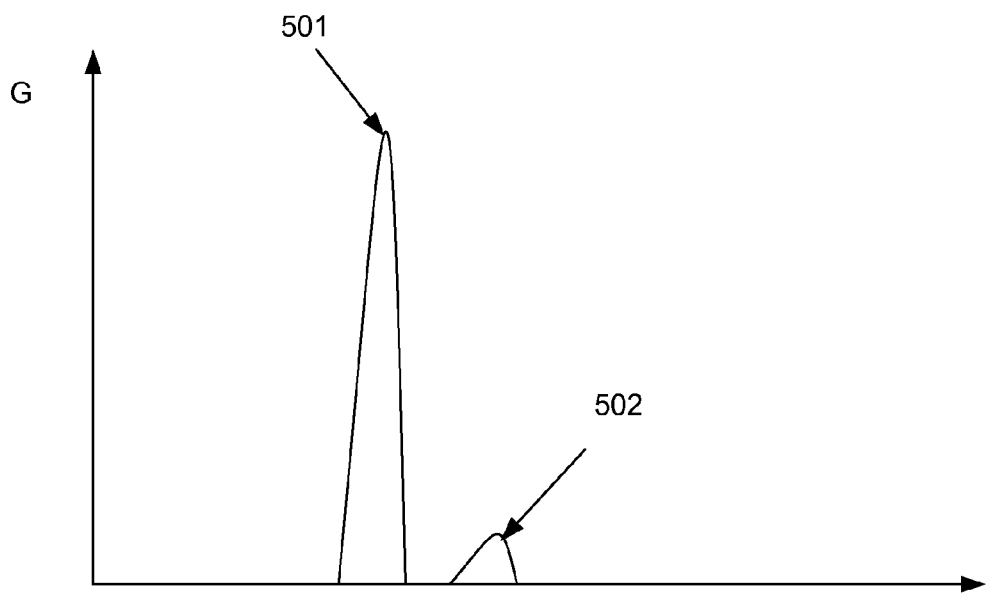

FIG. 5b depicts the same hypothetical resonator for the case in which the substrate comprises an ETIP. The conductance of TFE mode 502 is seen to be $\frac{1}{10}^{th}$ of the conductance of the LFE mode 501.

Figure 6:
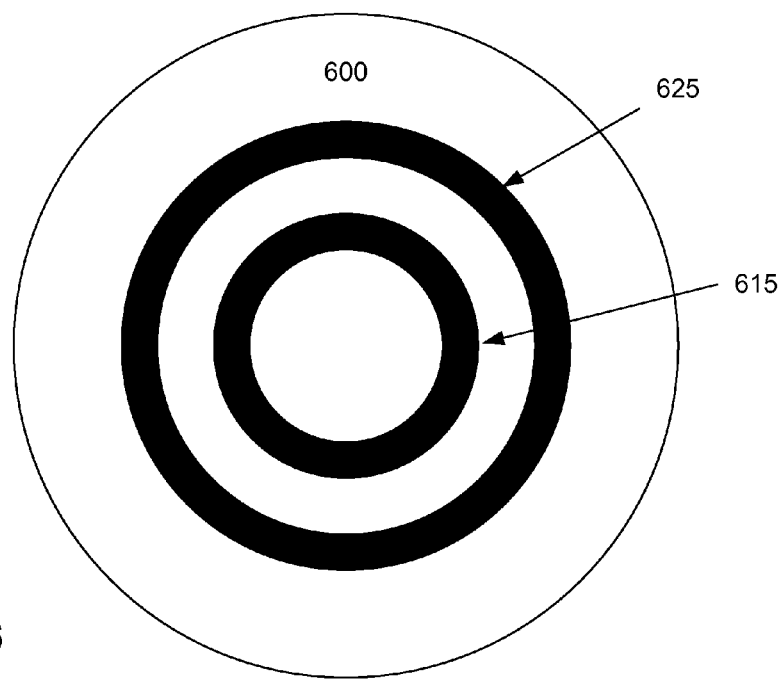
FIG. 6 illustrates the simplified structure of a coplanar circularly polarized transducer (CCPT) to excite CP-TSM via LFE.
Figure 2B:
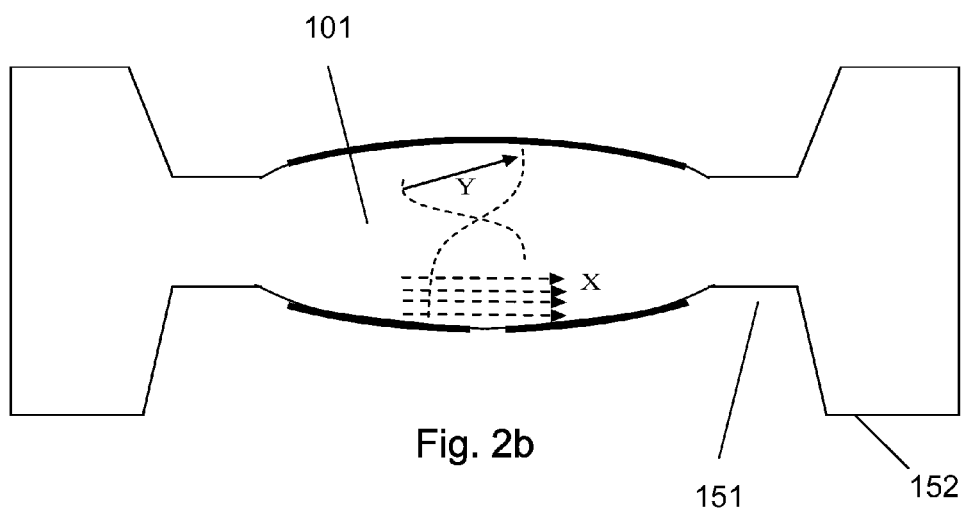
FIG. 2b depicts a resonator using lateral field excitation (LFE) with inverted mesa.
Figure 3:
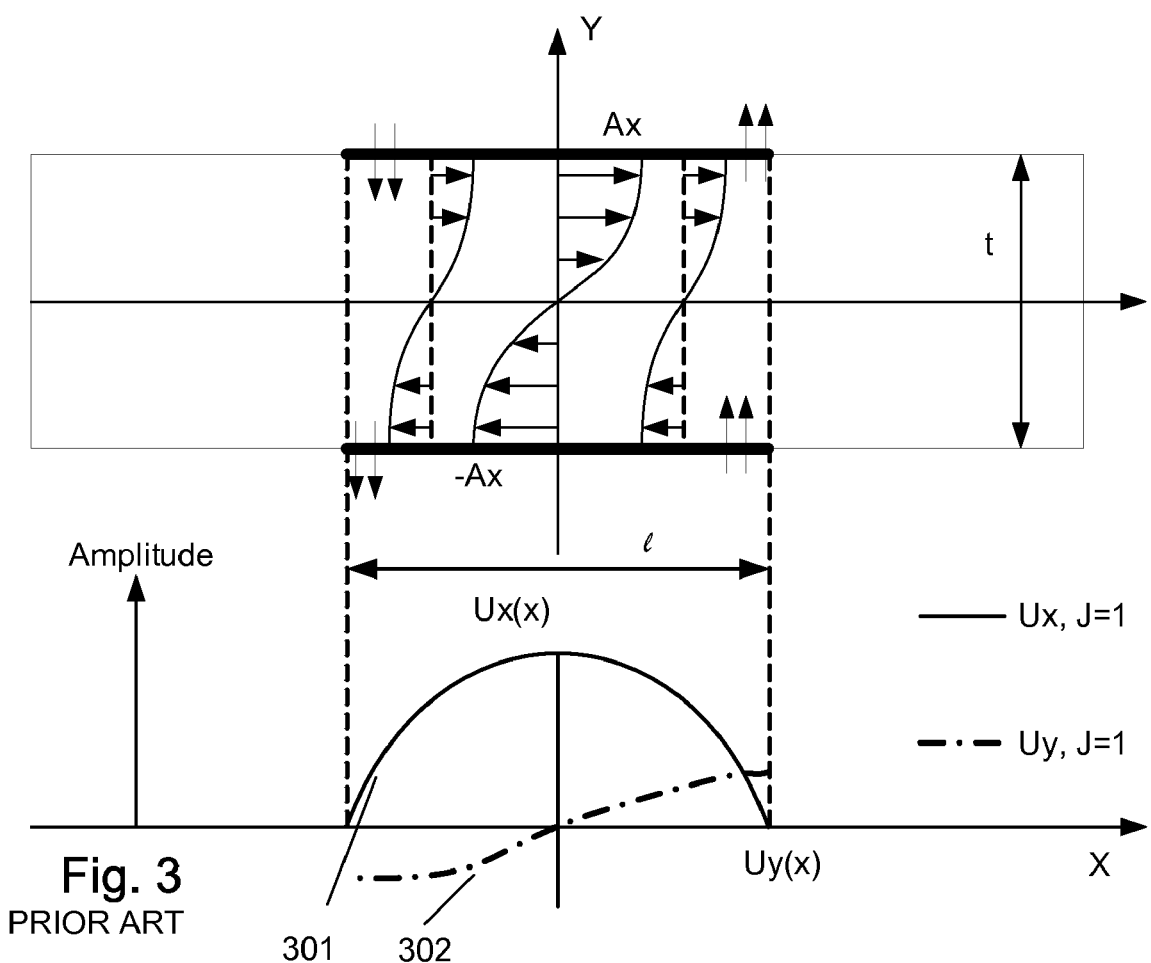
FIG. 3 depicts a standing wave in a thickness shear mode resonator having amplitude parallel to the surface, Ux, exhibiting divergence and the associated normal component, Uy, required to balance it.
Figure 4A:
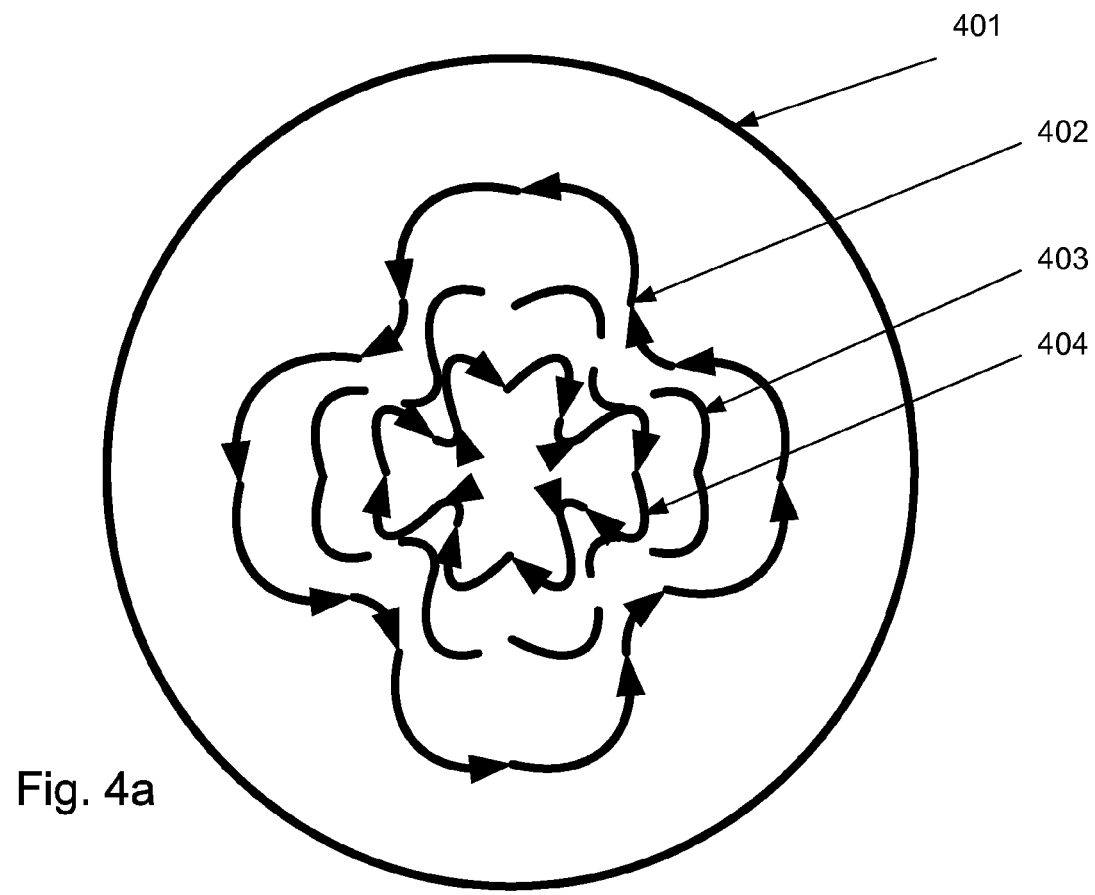
FIG. 4a depicts an idealized set of field lines for a solenoidal displacement having no divergence.
Figure 4B:
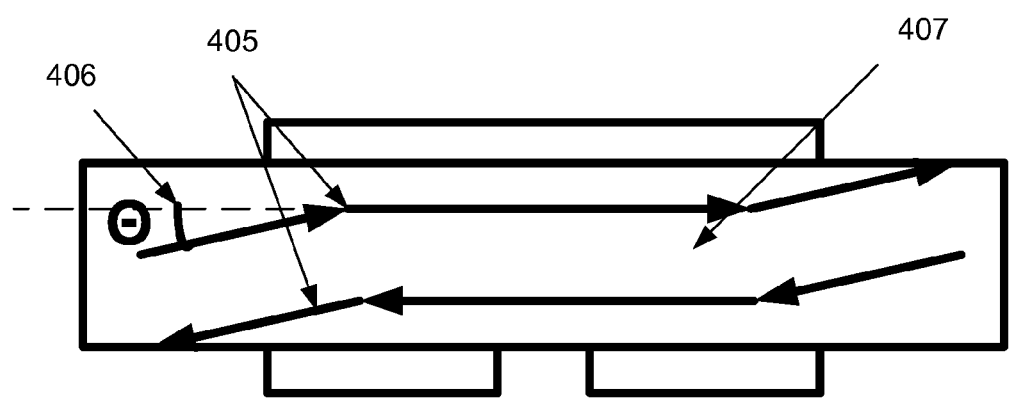
FIG. 4b is a schematic cross-cut of a crystal showing the simplified angle of a vector displacement to the surface.

FIG. 6 depicts a simple embodiment of the invention. Ground electrode 615 and driven electrode 625 interacting with functionally Z-cut piezoelectric material 600, results in a lateral field excitation driving a thickness shear mode resonance, which results in circularly polarized displacements.

Preferably $e_{14}$ defines the coupling of X-polarized electric fields to YZ shear stresses and strains, while $e_{25}=-e_{14}$ defines the coupling of Y-polarized electric fields to XZ shear stresses and strains. Applying these constants to a plate of material 600 with thickness parallel to Z, results in the equal and opposite constants coupling to the two polarizations of thickness shear energy. Such material offers tangential excitation of a circularly polarized mode and represents one embodiment of a quadrature symmetry piezoelectric (QSP) material. Preferably the material is also an ETIP and most preferably the material belongs to symmetry group 422 or 622 having only these two piezoelectric constants.

By examining the elastic constant tensor, it is seen that $C_{44}=C_{55}$ for Z-cut. Therefore the resonant frequencies of the two polarizations are identical for identical electrode design. It is further seen that judicious vector addition with the correct relative sign of the coupling provides a circular polarization of shear displacement for radially-polarized electric fields. This is accomplished in symmetry groups 32, 422, 622, and ∞2. One skilled in the art will now understand that substantially coaxial electrodes, as seen in FIG. 6b, on the surface of a Z-cut crystal of these symmetry groups will force a circularly polarized mode of acoustic displacement through radially polarized lateral field excitation with no parasitic thickness field excitation.

While there exist no piezoelectric coupling to undesired modes for Z-cut in these symmetry groups, there may exist mechanical coupling to the face shear mode determined by $C_{66}$ or to extensional-compressional modes for substrates having non-zero $C_{14}$. While the prior art sensors had a ratio of plane-normal to in-plane acoustic displacements vector field determined by the ratio of thickness to length, the present invention can be assumed to have said ratio roughly proportional to $|C_{14}/C_{44}|$. Thus a preferred embodiment of the present invention employs a piezoelectric crystal of one of symmetry group 622, 422, ∞2, or $\bar{6}$ having zero C14 or of symmetry group 32 having trivial C14 with a thickness defined substantially parallel to the Z crystallographic axis. In the case of symmetry group 32 this requires judicious materials selection or combination to minimize or cancel $C_{14}$ by design. In contrast the remaining symmetry groups offer $C_{14}$ identically zero by crystal symmetry.

While α-quartz belongs to point symmetry group 32, β-quartz belongs to group 622, but it is unstable at typical ambient temperatures. Other crystals of interest have symmetry group 422 include dicalcium lead proprionate, dicalcium strontium proprionate and α-TeO$_2$, the latter being commercially available. Many organic crystals fall in this group. Crystal symmetry groups 422, 622, and ∞2 have higher symmetry such that not only $C_{14}$, but also $e_{26}=0$ and offer only the desired mode. This family of crystal symmetries is the most preferred for the present invention, having no piezoelectric coupling to undesired modes of vibration. Nonetheless the overwhelming majority of commercially-available, suitable materials are of symmetry group 32.

The most preferable substrate for LFE of TSM is a quadrature symmetry piezoelectric, effective thickness inactive piezoelectric (ETIP), and effective pure shear substrate, satisfying $e_{14}\sim-e_{25}$ and $e_{15}\sim e_{24}\sim 0$, and having aggregate elastic constants with magnitudes satisfying $C_{44}\sim C_{55}$, $|C_{45}|<<|C_{44}|$, and $|C_{14}|<<|C_{44}|$. Most preferably such a substrate would also have $e_{16}\sim e_{26}\sim 0$.

In another embodiment, a circularly-polarized radial-shear mode (CP-RSM) resonator is disclosed. A generalization of the invention to thickness-N, radial-M modes exists and their implementation as generalized circularly polarized shear mode (CP-SM) resonators is included. In practice, even a "pure" CP-TSM having radial-M=0 has some radial dependence; however in certain symmetry cases it is possible to preferentially excite the radial shear modes with thickness-N=0.

Crystal symmetry group $\bar{6}$ offers a piezoelectric constant matrix of the desired form having only $e_{16}$ and $e_{26}$ for shear terms and having the associated compressional excitation related to these constants. In the special case of symmetry group 6 wherein $e_{26}\sim-e_{16}$, one observes another form of circularly polarized excitation. In this special case an X directed electric field creates the stress and strain being the derivative of $U_y$ along X and a Y directed electric field creates the stress and strain being negative the derivative of $U_x$ along Y. The result of a radial electric field would be a circularly polarized radial shear mode (CP-RSM) or disk-torsion. This radial shear mode has a fundamental mode with no thickness variation (N=0). The modes can be excited with $M^{th}$ order radial functions, approximated by Bessel functions modified for inhomogeneity and other geometrical factors, including M=0.

A material or composite having the desired properties disclosed herein, would allow a planar device with low frequency operation, no out of plane vibration, no sensitivity to thickness field variations, and the ability to hermetically package the electrodes. Such a resonator would address a long unmet need for high performance viscosity measurement of polymers and slurries.

The preferable substrate for LFE of RSM is a quadrature symmetry piezoelectric, effective thickness inactive piezoelectric (ETIP), and effective pure shear substrate, satisfying $e_{16}\sim-e_{26}$ and $e_{15}\sim e_{24}\sim e_{14}\sim e_{25}\sim 0$, and having aggregate elastic constants with magnitudes satisfying $C_{44}\sim C_{55}$, $|C_{45}|<<|C_{44}|$, and $|C_{14}|<<|C_{44}|$.

In general, a disk with modes conforming to cylindrical coordinates will have both thickness and radial variations of the circularly polarized shear mode. Since planar substrates have widths more than four times their thickness, the frequency of the modes is primarily determined by the harmonic of the thickness variation. The thickness dependence of the $N^{th}$ order harmonic is $\sim N\pi/2$ across the thickness, where N>0. The purely radial shear mode corresponds to N=0. For each value of N, there exists a series of $M^{th}$ order trapping functions along the radial axis that are determined by the electrode structure and crystal shape. These are analogous to the an harmonics discussed in Stevens and in U.S. Ser. No. 12/036,125. The simplest radial mode profile has no radial zero crossings other than r=0 and is the $0^{th}$ radial mode.

In the most general case there is provided a series of circularly polarized shear mode (CP-SM) resonances having an $N^{th}$ order thickness dependence, an $M^{th}$ order radial dependence, and a $K^{th}$ order angular dependence.

The preferred CP-SM will have primarily angular components of acoustic displacement with incidental radial components as a byproduct of symmetry conditions and vanishing plate normal components. The angular amplitudes would be described by $$U_\phi = U_o F_M(r) \sin(N\pi z/t)\cos(K\phi)$$

where $F_M(r)$ can be expected to be related to a Bessel function of $M^{th}$ order, N is the thickness shear harmonic number, t is the plate thickness along Z with z=0 at the center, and K is an anharmonic number describing the angular modes. Only the modes having K=0 will be completely solenoidal.

From a practical sense, the frequency of a given mode in a structure of nominal thickness, t, and average electrode radius, $r_o$, can be roughly estimated as $$\omega = V_P \sqrt{\left(\frac{N\pi}{t}\right)^2 + \left(\frac{M\pi}{r_o}\right)^2 + \left(\frac{K}{r_o}\right)^2}$$

where typically $r_o>>t$. The N=0 mode offers the benefit of lower frequency operation in a given size. Lower frequency sensors are known to offer better viscosity measurement accuracy for inhomogeneous fluids and for non-Newtonian fluids. In view of the typical requirement of thickness shear mode devices in the prior art it can be expected that $r_o$ will be on the order of 5t or more. One would thus expect there to be several distinguishable $M^{th}$ anharmonic modes associated with each value of N. One would also expect K=0, 1, 2, and 3 to be observable for each N and M prior to the onset of the next highest $M^{th}$ mode; however these modes have divergence and therefore significant out of plane motion. Proper electrode design is needed to limit the number of allowed $M^{th}$ anharmonics and to restrict operation to small numbers for N.

FIG. 7 tabulates some known candidates for providing a "thickness torsional substrate". The most mature materials have |C14|>0.1*|C44| and, a side from lanthanum gallium silicate, also have low e14. The latter is only a concern for certain applications. Nonetheless composites of the lanthanum gallium "X" (silicate, niobate, tantalate, etc.) and alloys could provide a composite substrate with the desired properties. The properties of α-SiO2 and α-AlPO4 are also suboptimal but composites comprising the above material or materials, optionally in combination with other materials, could provide the desired aggregate properties. The related α-GaPO4 has the desired elastic properties but somewhat low e14.

In general, $(Sr,Ca)_3(Ta,Nb)(Ga,Al)_3$ silicate crystals (STGS, SNGS, CTGS, CNGS, CTAS, CNAS, STAS, and SNAS) give excellent properties. Strontium tantalum gallium silicate (STGS) has the desired elastic properties but is reported to have near-zero $e_{14}$. Alloys of these materials are of specific interest since the pure compounds' properties straddle the ideal properties. It is reasonable to expect an alloy could be developed with the ideal conditions well approximated. The aluminum derivatives, strontium (niobium, tantalum) aluminum silicate (SNAS, STAS) are as yet unmeasured but are expected to be promising.

Tellurium dioxide offers excellent properties including good $e_{14}$ and zero $C_{14}$. Furthermore the interfering $C_{66}$ mode is well removed, reducing the likelihood of energy coupling.

While the simple structure of FIG. 6 depicts a single piezoelectric layer and a single transducer as an embodiment of the invention, multi-layer structures are explicitly contemplated. In one such case a plurality of layers of thickness λ/2 may exist with alternating polarity lateral field electrodes optionally located at each layer interface. The skilled in the art will recognize that proper dimensioning of a structure such as depicted in FIG. 10, combined with appropriate electrode polarity provides such embodiment by way of example.

Other embodiments may be obtained by combining the present invention with U.S. patent application Ser. No. 12/202,431 entitled 'Asymmetric Composite Acoustic Wave Sensor' to Andle et al. (which is hereby incorporated by reference in its entirety) to obtain the structure of FIG. 8*a*. The '431 invention provides a composite structure comprising a rigid structural element coupled to a piezoelectric plate, so as to provide continuous mechanical displacement amplitude, phase and stress relationship at the energy interface formed therebetween. By selecting specific materials and dimensioning those materials a resonant frequency wave imparted to one side of the composite structure, shall travel to the other side and back with minimal energy loss, without presenting undue mechanical stresses to any joining interfaces, and with good acoustic coupling of the wave properties to the conditions on the other side. Doing so will allow the composite to present the electrical efficiency of fundamental-mode oscillatory operation, without suffering from the disadvantages of a thick piezoelectric plate while exhibiting the mechanical toughness of a thick plate. Coplanar concentric electrodes 803 and 804 on piezoelectric medium 801 are affixed to rigid structural element embodied in plate 811. In the case of nonconducting plate 811 the electrodes 803 and 804 could be located at the inner boundary as shown in FIG. 8*b*. In the embodiment shown FIG. 8*b*, nonconducting or semiconducting carrier plate 821 provides a separate region 822. In at least one embodiment the carrier plate is a semiconductor having suitable thermal expansion and acoustic impedance properties to form an asymmetric composite resonator. In this embodiment optional electronic circuitry is included in region 822. Insulating or semiconducting region 821 may also provide buried conducting regions providing the electrical connections to the electrodes.

In another embodiment, the present invention is combined with PCT application No. PCT/US06/015510, published as WO/2007/123537, entitled "Electro Acoustic Sensor for High Pressure Environments", to Andle (This application was also filed as U.S. Ser. No. 11/814,074, and is incorporated herein by reference in its entirety). PCT/US06/015510 provides for a substrate for a piezoelectric sensor, consisting of a composite of two nearly identical substrates. The composite substrate provides a self-passivating probe in which the active electrical connections and electrodes of the piezoelectric sensor are located at or near the centerline of the composite substrate and the outer surfaces are either grounded or electrically inactive. FIG. 9 illustrates coplanar coaxial electrodes 903 and 904 placed at the interface between piezoelectric plates 901 and 902.

Combining the present invention with WO/2007/123537 and U.S. Ser. No. 12/202,431 provides a symmetric composite resonator as shown in FIG. 10 having one set of coplanar coaxial electrodes 1003 and 1004 located at the interface of one piezoelectric region 1001 to the carrier plate 1021 and another pair of electrodes 1033 and 1034 located at the interface between a second piezoelectric plate 1031 and the carrier plate 1021. In at least one embodiment the carrier plate is a semiconductor having suitable thermal expansion and acoustic impedance properties to form an asymmetric composite resonator. In this embodiment optional electronic circuitry is included in region 1022. Optionally, an insulating or semiconducting region 1021 comprises buried conducting regions, providing the electrical connections to the electrodes.

The simplest example of coplanar coaxial electrodes has been considered thus far. Numerous other electrode configurations can be devised through which various embodiments of this invention may be practiced, and such will be clear in view of the present teachings. The simple case may be practiced as shown by way of example in FIG. 11*a* with direct electrical connection to provide a simple resonator. The resulting two-terminal device will have electrical properties that can be modeled using the well known Butterworth-Van Dyke model. The parallel capacitance consists of the electrostatic capacitance between electrodes. The series resonance in parallel with this capacitance models the mechanical resonance of the desired shear mode.

Figure 11A:
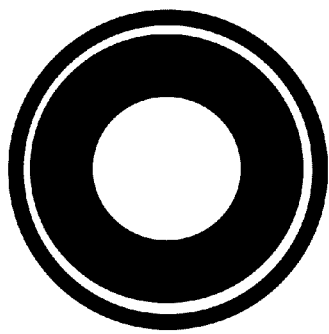
Figure 11B:
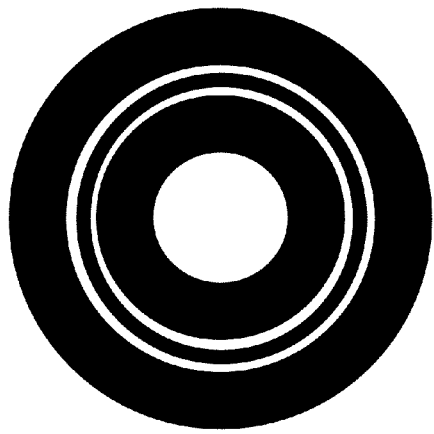
Figure 11C:
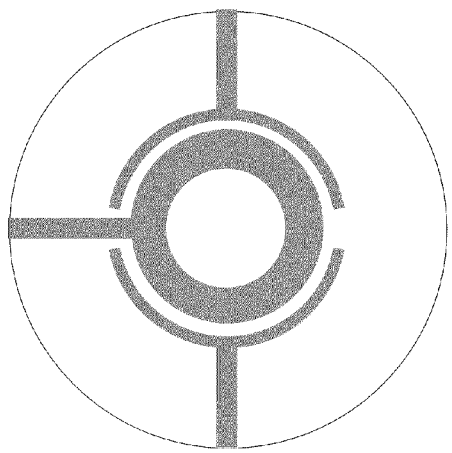

FIG. 11*a* shows the simple coaxial coplanar electrodes with the outer electrode having different annular width than the inner electrode. The relative annular and/or radial widths and gap spacings will constitute technical choices selected according to desired resonator parameters. FIG. 11*b* shows the addition of a third coplanar coaxial electrode. If the central ring were employed as a common electrode then the inner and outer electrodes would form distinct input and output transducers to the common reference electrode. It is well known that such three-terminal devices offer desirable properties, the most significant of which is that the transfer impedance from the input to the output is no longer connected in parallel to the transducer static capacitance.

The complete symmetry of the structures of FIG. 11a and FIG. 11b allows the most efficient coupling only to modes with zero value of K. This is desirable in some applications; however there are applications such as the measurement of density wherein a nonzero K mode is desired. The structure of FIG. 11c splits the outer electrode into two semicircular portions. This fits the definition of a coplanar circularly polarized transducer (CCPT) since the two semi-circular electrodes substantially form a circular shape that completely encloses the inner electrode with a gap therebetween. As the break in the outer circle and the protrusion of an electrical connection therebetween causes only minimal disturbance to the functionality of the CCPT, such design falls squarely within the definition. Similarly, other designs should be construed as falling within the definition of a CCPT as long as such designs excite the generally circularly polarized perturbations within the crystal.

For modes with K=0 the voltages on the two electrodes with respect to the common inner electrode are in phase and the three terminal device has zero or nearly zero phase shift at its resonant peak. The break in the outer electrode is used to advantage to bring the inner electrode to an electrical connection at the edge of the substrate. For K=1 the split electrodes have opposite polarity and a coupled resonance with ~=180° of phase shift results.

Figure 11D:
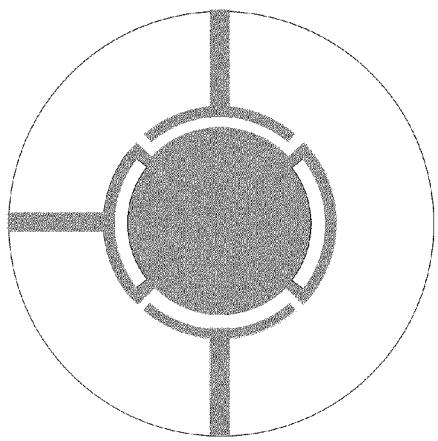

FIG. 11d illustrates an analogous structure in which 90° arcs of the outer electrode are coupled and the unused arcs are connected to the inner electrode to complete the energy trapping region. This structure is intended to equalize coupling to the K=1 and K=2 modes.

While the evaluation has suggested that Z-cut (also called c-cut) is the preferred embodiment, one skilled in the art will realize that slight deviations from an ideal set of cut angles will offer some of the advantages disclosed herein. Thus a Z-cut should generally be construed as relating to a 'functional Z-cut', wherein the deviation from the pure Z-cut crystallographic axis is considered trivial as long as the structure provides sufficiently close characteristics to the pure Z-cut for obtaining the functionality described therefore. One will also appreciate that slight intentional deviations from Z-cut might be preferred to optimize some other parameter at the expense of moderate increases in out of plane displacements.

Crystal symmetry is a complex field of study with a confusing terminology. It is expected that alternate terminologies and descriptions of material symmetry groups and orientations might be employed and it is assumed that the scope of the claims is to be expanded to cover differences in terminology for arrangements of matter and geometrical selection of orientation that result in material properties meeting the equivalent properties of Z-cut of the stated symmetry groups.

There is a growing field of materials science in which composites are designed to specifically obtain a functional behavior based on the structural arrangement of the individual materials as opposed to their individual properties. There also exist advances in functionally graded materials and nanocomposite materials. By way of example, a composite made from class 32 symmetry materials could have aggregate properties of a class 422, 6 mm or ∞2 crystal. The present invention also contemplates composite and layered structures in which the aggregate coupling of the various regions to the desired mode adds constructively while the aggregate coupling to the undesired modes adds destructively. Stacking layers with half of the layers having crystalline Y in a given direction and the other half having crystalline X in said direction would be invariant to the radial excitation of a circularly polarized wave; however it would reduce $e_{11}$, $e_{12}$, and $e_{26}$. Other arrangements of layers can be readily devised to provide destructive interference of the coupling to unwanted modes. Periodic poling of domains is also an available and equivalent alternative to assembling layers. The use of different materials in each layer could further reduce or even eliminate the aggregate values of the unwanted constants. Other functionally blended materials are also explicitly contemplated as are doped variants of specific materials listed herein. These composites are to be considered as functionally having the symmetry class and orientation that best describes them as if they were, in fact, a single crystal material.

One skilled in the art of crystal growth will appreciate that slightly doping a crystal with other materials could result in the further reduction of the elastic constant $C_{14}$. Blended alloys of $(Sr,Ca)_3(Ta,Nb)(Al,Ga)_3$ silicate might be developed that provide even lower $C_{14}$ and even higher $e_{14}$. Doped crystals, alloys of crystals, and composites of crystals specifically claimed are also considered to be claimed.

The electrodes need only be located on one surface and fluid loading can be restricted to the opposite face. If the opposite face is left unmetallized then the properties of the sensor will be affected by electrical perturbations as is known for many piezoelectric structures. When the intended sensing mechanism is other than electrical loading, the most preferred embodiment employs complete metallization of the exposed surface, most preferably with a refractory metal and other coatings as disclosed in PCT application No. PCT/US2006/15537, published as WO 2007/123539, "Coating for Harsh Environments and Sensors Using Same", to Andle et al (This application was also filed as U.S. Ser. No. 11/814,167, and is incorporated herein by reference in its entirety).

The specifications are drawn to providing a resonator having low spurious signals or having low out of plane vibration components for at least one desired mode. In light of the teachings provided herein, one skilled in the art will readily see that the anharmonics associated with K≠0 have potentially large out of plane components. As such, one will now see that a combination of a K=0 mode with one or more modes having nonzero K can be advantageously used to practice the methods disclosed in U.S. Ser. No. 12/036,125, discussed supra.

While FIGS. 6 and 8-11 illustrate circular electrode geometries consistent with $C_{14}=0$ on Z-cut, the invention can be practiced on less optimal substrates and the ideal electrode shape may be non-circular. Ellipses and higher order curved surfaces such as three, four and six lobed ellipsoidal structures could result from trigonal, quadric and hexagonal symmetry by way of non-limiting examples. Such embodiments are considered within the scope of the claims.

By splitting the outer electrode into two semicircular regions it is possible to create a circularly polarized monolithic crystal filter (CP-MCF). The CP-MCF offers a separate input and output electrical port as the two outer semicircles relative to the common inner electrode. The preferred location for the split is at +Y and −Y such that the fields between the electrodes are in the X direction and do not couple to spurious face shear modes through $e_{26}$. Instead splitting the inner electrode is a trivial modification.

It will be appreciated that the invention is not limited to what has been described hereinabove merely by way of example. While there have been described what are at present considered to be the preferred embodiments of this invention, it will be obvious to those skilled in the art that various other embodiments, changes, and modifications may be made therein without departing from the spirit or scope of this invention and that it is, therefore, aimed to cover all such changes and modifications as fall within the true spirit and scope of the invention, for which letters patent is applied.

What is claimed is:

1. A mechanical planar structure comprising:
   a substrate comprising an effective thickness inactive piezoelectric (ETIP) material, said ETIP being a material, composite material, structure, or composite structure such that, if the thickness direction is defined to be X3 (Cartesian Z), then the aggregate piezoelectric properties provide a trivial value for the sum of the squares of the six piezoelectric constants, e3J, compared to the sum of the squares of the remaining shear coupling constants, e14, e15, e16, e24, e25, and e24;
   a plurality of coplanar electrodes coupled to said ETIP, said electrodes being separated by at least one gap, said electrodes being excitable by an alternating electric potential;
   wherein when said electrodes being coupled to said potential, said ETIP supports lateral field excitation (LFE) of a thickness shear mode.

2. A mechanical planar structure as claimed in claim 1, wherein said substrate comprises a composite material.

3. A mechanical planar structure as claimed in claim 2, further comprising:
   a rigid protector plate having a driven face and a sensing face, and further having a thickness which is substantially a multiple of half wavelength of a resonant frequency of said substrate;
   said substrate having an excitation face, and being of thickness of substantially a multiple of half wavelength of said resonant frequency in said plate;
   said coplanar electrode being cowled to said excitation face;
   said substrate being coupled to said plate, and forming an energy interface therebetween;
   such that a wave of said resonant frequency traveling between said excitation face and said sensing face, shall form a substantially continuous-phase wave, at substantially peak displacement amplitude, at the energy interface.

4. A mechanical planar structure as claimed in claim 1, wherein said substrate, or a portion thereof, comprises a plurality of piezoelectric regions being aligned to have their crystallographic Z axis substantially perpendicular to the surfaces of said planar structure.

5. A mechanical planar structure as claimed in claim 1 wherein said ETIP comprises one or more piezoelectric regions, at least one of which being selected to belong to a symmetry group chosen from symmetry groups 32, 422, 622, $\infty 2$, and $\bar{6}$ or a combination thereof.

6. A mechanical planar structure as claimed in claim 1, wherein said substrate having a layer comprised of one of the following piezoelectric materials:
   CNGS, CTGS, CTAS, CNAS, $\beta SiO_2$, $\alpha$-$TeO_2$, STGS, SNGS, STAS, SNAS, an alloy of $(Sr,Ca)_3(Nb,Ta)(Ga,Al)_3Si_2O_{14}$, and any combination thereof.

7. A mechanical planar structure as claimed in claim 1, wherein said substrate is selected to have a magnitude of the rotated aggregate elastic constant $C_{14}$ being less than 0.1 times the magnitude of $C_{44}$.

8. A mechanical planar structure as claimed in claim 1, wherein said substrate is selected to have a magnitude of the rotated aggregate piezoelectric constant $e_{26}$ being less than 0.1 times the magnitude of $e_{14}$.

9. A mechanical planar structure as claimed in claim 1 wherein said substrate, or a portion thereof, forms an inverted mesa.

10. A mechanical planar structure as claimed in claim 1, wherein said ETIP comprises of a plurality of piezoelectric regions wherein at least one of said regions is not an ETIP, but wherein the aggregate of said plurality of regions forms an ETIP.

11. A mechanical planar structure as claimed in claim 1, wherein said electrodes are substantially concentric.

12. A mechanical planar structure as claimed in claim 1, wherein said ETIP is selected to approximate or satisfy $e_{14}$~$e_{25}$ and $e_{15}$~=$e_{24}$~=0, and have aggregate elastic constants with magnitudes approximating or satisfying $C_{44}$~$C_{55}$, $|C_{45}|<<|C_{44}|$, and $|C_{14}|<<|C_{44}|$.

13. A mechanical planar structure as claimed in claim 1 wherein said ETIP comprises a material having only symmetry group 422, 622, $\infty 2$, or a combination thereof.

14. A mechanical planar structure supporting circularly polarized shear modes, comprising:
   a substrate comprising quadrature symmetry piezoelectric (QSP) material;
   a plurality of coplanar circularly polarized electrodes (CCPEs) coupled to said substrate, and being separated by at least one gap therebetween, said electrodes being excitable by an alternating electric potential;
   wherein when said electrodes being coupled to said potential, said substrate supports circularly polarized lateral field excitation (CP-LFE) of a shear mode resonance.

15. A mechanical planar structure as claimed in claim 14, wherein said substrate comprises a composite material.

16. A mechanical planar structure as claimed in claim 14, wherein said material comprises an ETIP.

17. A mechanical planar structure as claimed in claim 16, further comprising:
   a rigid protector plate having a driven face and a sensing face, and further having a thickness which is substantially a multiple of half wavelength of a resonant frequency of said substrate;
   said substrate having an excitation face, and being of thickness of substantially a multiple of half wavelength of said resonant frequency in said plate;
   said coplanar electrode being coupled to said excitation face;
   said substrate being coupled to said plate, and forming an energy interface therebetween;
   such that a wave of said resonant frequency traveling between said excitation face and said sensing face, shall form a substantially continuous-phase wave, at substantially peak displacement amplitude, at the energy interface.

18. A mechanical planar structure as claimed in claim 14, wherein said substrate, or a portion thereof, comprises a plurality of piezoelectric regions being aligned to have their crystallographic Z axis substantially perpendicular to the surfaces of said planar structure.

19. A mechanical planar structure as claimed in claim 14 wherein said substrate comprises one or more piezoelectric regions, at least one of which being selected to belong to a symmetry group chosen from symmetry groups 32, 422, 622, $\infty 2$, and, or a combination thereof.

20. A mechanical planar substrate as claimed in claim 14, wherein said substrate comprises a material belonging to symmetry group $\bar{6}$.

21. A mechanical planar structure as claimed in claim 14, wherein said substrate having a layer comprised of one of the following piezoelectric materials:
   CNGS, CTGS, CTAS, CNAS, $\beta SiO_2$, $\alpha$-$TeO_2$, STGS, SNGS, STAS, SNAS, and an alloy of $(Sr,Ca)_3(Nb,Ta)(Ga,Al)_3Si_2O_{14}$, and any combination thereof.

22. A mechanical planar structure as claimed in claim 14, wherein said substrate us selected to have a magnitude of the rotated aggregate elastic constant $C_{14}$ being less than 0.1 times the magnitude of $C_{44}$.

23. A mechanical planar structure as claimed in claim 14, wherein said substrate is selected to have a magnitude of the rotated aggregate piezoelectric constant $e_{26}$ being less than 0.1 times the magnitude of $e_{14}$.

24. A mechanical planar structure as claimed in claim 14, wherein said substrate, or a portion thereof, forms an inverted mesa.

25. A mechanical planar structure as claimed in claim 14, wherein said ETIP comprises of a plurality of piezoelectric regions wherein at least one of said regions is not an ETIP, but wherein the aggregate of said plurality of regions forms an ETIP.

26. A mechanical planar structure as claimed in claim 14, wherein said electrodes are substantially concentric.

27. A mechanical planar structure as claimed in claim 14, wherein said substrate is selected to satisfy $e_{14} \sim e_{25}$ and $e_{15} \sim e_{24} \sim 0$, and have aggregate elastic constants with magnitudes satisfying $C_{44} \sim C_{55}$, $|C_{45}| \ll |C_{44}|$, and $|C_{14}| \ll |C_{44}|$.

28. A mechanical planar structure as claimed in claim 14, wherein said ETIP comprises a material having only symmetry group 422, 622, $\infty 2$, or a combination thereof.

29. A mechanical planar structure as claimed in claim 13, wherein a first of said plurality of electrode is substantially circular in form, and at least a second and a third of said plurality of electrodes are arcuate in form and are disposed externally to said circular electrode.

30. A mechanical planar structure as claimed in claim 14, wherein said resonance is a thickness shear mode resonance.

31. A mechanical planar structure as claimed in claim 14, wherein said resonance is a radial shear mode resonance.

32. A mechanical planar structure as claimed in claim 14, wherein said substrate comprises a first and a second layers of QSP material, said first and second layers each having a thickness of substantially a multiple of a resonant wavelength of said structure, wherein said first and second layers being in face to face relationship therebetween, and wherein said electrodes are disposed between said first and second layers.

33. A mechanical planar structure as claimed in claim 32, wherein said first layer differs in thickness from said second layer.

34. A mechanical planar structure as claimed in claim 18, wherein said functionally Z-cut oriented regions are differently rotated about the Z axis to provide destructive interference of coupling between the lateral fields and spurious modes.

35. A mechanical planar structure as claimed in claim 14, wherein said substrate comprises a plurality of layers, each of said layers having a thickness of a multiple of $\lambda/2$ and wherein said electrodes are disposed at an interface of at least two of said layers and arranged to excite alternating polarity lateral fielding said two layers.

36. A mechanical planar structure as claimed in claim 14,
wherein said structure supports at least a first mode being substantially pure shear with no circumferential variance of amplitude (K=0), and at least a second mode having intentional circumferential variance of amplitude (K≠0) so as to have significant non-tangential displacement components;
wherein said first and said second modes being electrically responsive to viscosity-density product of an adjacent material with substantially equal sensitivity, $S_v$;
and wherein said first and said second modes being electrically responsive to elasticity-density product of an adjacent material with unequal sensitivities, $S_{\rho 0}$ and $S_{\rho 1}$.

37. A mechanical planar structure as claimed in claim 14, wherein said CCPE forms a two-port CCPT having separate input and output ports;
wherein said CCPT comprises:
a substantially complete circular common electrode;
a plurality of arcuate segments functionally enclosing said common electrode;
at least a first of said segments forming an input transducer with respect to said common electrode;
at least a second segment forming an output transducer with respect to said common electrode.

38. A mechanical planar structure as claimed in claim 37 wherein said first segment and said second segment defining a split therebetween, said split being positioned such that electric fields between said segments traversing said split are substantially aligned with the crystallographic X axis of said substrate.

* * * * *